(12) United States Patent
Nagasaka et al.

(10) Patent No.: US 6,558,822 B2
(45) Date of Patent: May 6, 2003

(54) CR-CONTAINING TITANIUM NITRIDE FILM

(75) Inventors: Hiroshi Nagasaka, Kanagawa (JP); Momoko Kakutani, Tokyo (JP); Matsuho Miyasaka, Kanagawa (JP); Tadashi Kataoka, Chiba (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/863,869

(22) Filed: May 24, 2001

(65) Prior Publication Data

US 2002/0017235 A1 Feb. 14, 2002

(30) Foreign Application Priority Data

May 25, 2000 (JP) ........................................ 2000-155330

(51) Int. Cl.$^7$ ................................................ B32B 9/00
(52) U.S. Cl. ........................ 428/700; 428/544; 428/615; 428/689; 428/699; 428/704; 117/952; 427/225.394
(58) Field of Search ................................ 428/457, 699, 428/704, 697, 698, 700, 544, 615; 117/952; 427/255.394

(56) References Cited

U.S. PATENT DOCUMENTS 6,177,754 B1 * 1/2001 Suzuki et al. .......... 310/323.09

FOREIGN PATENT DOCUMENTS

| EP | 0685439 | | 12/1995 |
| JP | 2000119842 A | * | 4/2000 |
| JP | 2001006200 A | * | 1/2001 |
| WO | WO 0/24947 | | 5/2000 |

OTHER PUBLICATIONS

H. Nagasaka et al., "Tribological properties of titanium nitride films prepared by dynamic ion beam mixing method," Nuclear Instruments and Methods in Physics Research B 121, pp. 279–282 (1997) No Month.

Y. Otani et al., "High temperature oxidation behaviour of $(Ti_{1-x}Cr_x)N$ coatings," Thin Solid Films 287, pp. 188–192 (1996) No Month.

D.B. Lee et al., "Comparative study on the oxidation of CrN, TiCrN and TiAlN coatings deposited on a steel substrate by ion plating," Zairyo–to Kankyo 50, pp. 582–586 (2001) No Month.

Patent Abstracts of Japan JP 08–209335; Aug. 13, 1996; cited in International Search Report No Date.

Patent Abstracts of Japan JP 11–189860; Jul. 13, 1999; cited in International Search Report No Date.

Y. Andoh et al.; "Crystalline Orientation Control by the IVD Method," Nuclear Instruments & Method in Physics Research, Section B: Beam Interactions with Materials and Atoms, North–Holland Publishing Comp.; vol. B39, No. 1–4 (Mar. 2, 1989).

P. Hones et al.; "Sputter Deposited Chromium Nitride Based Ternary Compounds for Hard Coatings," Thin Solid Films, Elsevier–Sequoia S.A. Lausanne, Ch, vol. 332, No. 1–2 (Nov. 2, 1998).

* cited by examiner

*Primary Examiner*—Deborah Jones
*Assistant Examiner*—Arden Sperty
(74) *Attorney, Agent, or Firm*—Armstrong, Westerman & Hattori, LLP

(57) ABSTRACT

The invention aims to provide a hard film which is improved in high-temperature corrosion resistance without impairing high sliding characteristics (wear resistance, low frictional coefficient) inherent in a titanium nitride thin film and which is suitable for a slide member such as a bearing or a seal used in rotary machines operated at a high temperature, such as a steam turbine and a gas turbine. For attaining this aim, the invention provides a Cr-containing titanium nitride film which is composed of a nitride containing Ti and Cr as main components, the crystal particles thereof having a face-centered cubic crystal structure, and the crystal thereof being highly oriented toward (200) face.

9 Claims, 19 Drawing Sheets

X-RAY DIFFRACTION PATTERN OF TiCrN FILMS

RELATION BETWEEN THICKNESS OF OXIDE LAYER AND Cr CONTENT IN EACH EXPOSURE TEST TIME (TEST TEMPERATURE: 450 °C)

DEPTH-DIRECTION XPS ANALYSIS OF EXPOSURE SURFACE AFTER HIGH-TEMPERATURE WATER VAPOR EXPOSURE TEST (WATER VAPOR EXPOSURE TEST CONDITIONS: TEST TEMPERATURE 450°C, TEST TIME : 1,000 hrs)

SPECTRUM OF Cr2p OF CORROSION LAYER ON TiCrN (3)-COATED SUS 420J2 STEEL AFTER EXPOSURE TEST (EXPOSURE TEST CONDITIONS: TEST TEMPERATURE 450°C, TEST TIME: 1,000 hrs)

SPECTRUM OF Ti2p OF CORROSION LAYER ON TiCrN (3)-COATED
MEMBER AFTER HIGH-TEMPERATURE WATER VAPOR EXPOSURE TEST

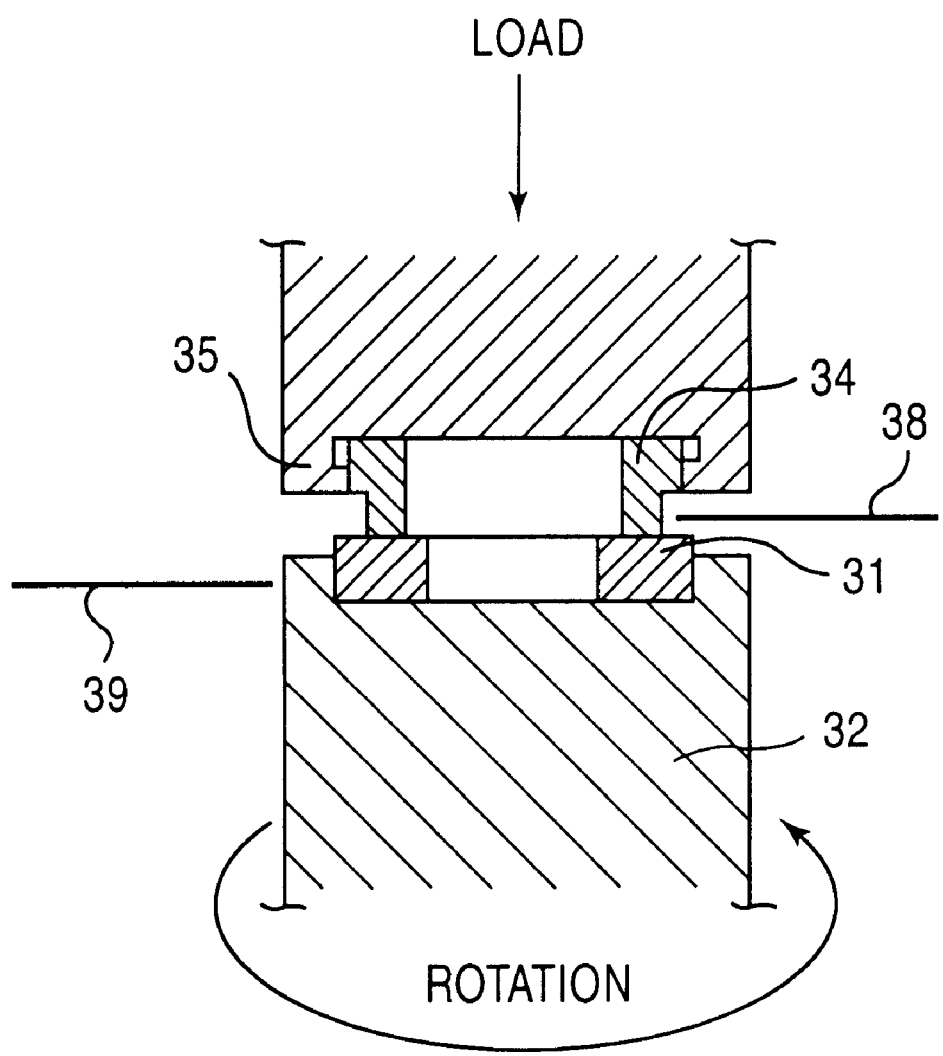

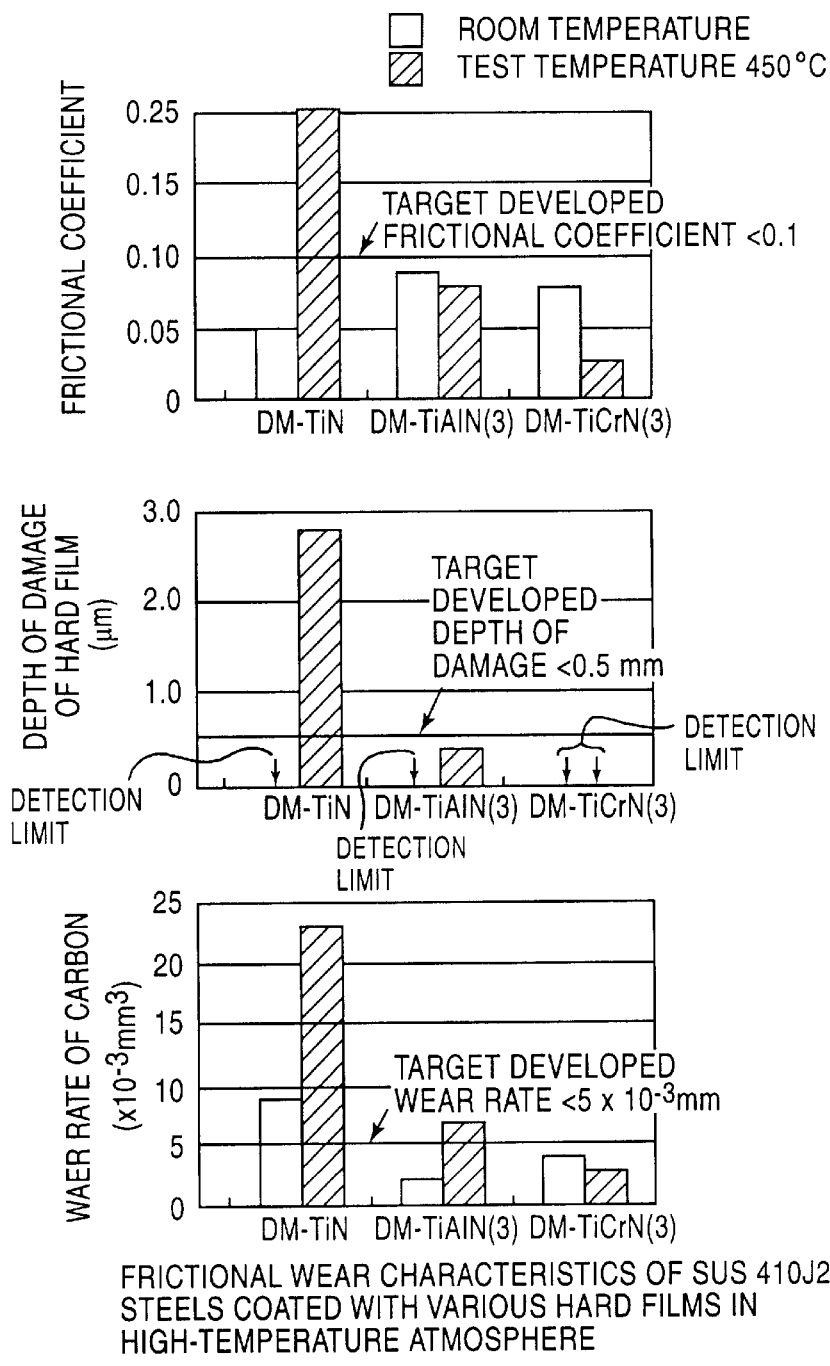

FRICTIONAL WEAR CHARACTERISTICS OF TiN-COATED SUS 410J2 STEEL IN HIGH-TEMPERATURE ATMOSPHERE AT 450°C (FRICTIONAL WEAR TEST CONDITIONS: SURFACE PRESSURE 0.8 MPa, PERIPHERAL SPEED 2.4 m/s)

FRICTIONAL WEAR CHARACTERISTICS OF DM-TiCrN (3)-COATED
SUS 420J2 STEEL IN HIGH-TEMPERATURE ATMOSPHERE AT 450°C
(FRICTIONAL WEAR TEST CONDITIONS: SURFACE PRESSURE 0.8 MPa,
PERIPHERAL SPEED 2.4 m/s)

DEPTH-DIRECTION XPS ANALYSIS OF SLIDE SURFACE ON
TiCrN (3)-COATED SUS 420J2 STEEL AFTER HIGH-TEMPERATURE
ATMOSPHERE SLIDING TEST AT 450°C

FRICTIONAL WEAR CHARACTERISTICS OF SUS 420J2 STEELS COATED WITH VARIOUS HARD FILMS IN HIGH-TEMPERATURE WATER VAPOR (450°C)

NOTE
1) FRICTIONAL WEAR TEST CONDITIONS: SURFACE PRESSURE 0.8 MPa, PERIPHERAL SPEED 2.4 m/s, RUNNING DISTANCE 5,000 m
2) AIP: ARC-TYPE ION PLATING METHOD
3) DM: DYNAMIC MIXING METHOD

FRICTIONAL WEAR CHARACTERISTICS OF TiN-COATED SUS 420J2 STEEL IN HIGH-TEMPERATURE WATER VAPOR AT 450°C (FRICTIONAL WEAR TEST CONDITIONS: SURFACE PRESSURE 0.8 MPa, PERIPHERAL SPEED 2.4 m/s)

FRICTIONAL WEAR CHARACTERISTICS OF TiCrN (3)-COATED SUS 420J2 STEEL IN HIGH-TEMPERATURE WATER VAPOR AT 450°C
(FRICTIONAL WEAR TEST CONDITIONS: SURFACE PRESSURE 0.8 MPa, PERIPHERAL SPEED 2.4 m/s)

DEPTH-DIRECTION XPS ANALYSIS OF SLIDE SURFACE ON
TiCrN (3)-COATED SUS 420J2 STEEL AFTER
HIGH-TEMPERATURE WATER VAPOR SLIDING TEST AT 450°C

RELATION BETWEEN HIGH-TEMPERATURE WATER VAPOR FRICTIONAL WEAR CHARACTERISTICS AND I(200) / I(111) XRD INTENSITY RATE FRICTIONAL WEAR TEST CONDITIONS (TEST TEMPERATURE 450°C, SURFACE PRESSURE 0.8 MPa, PERIPHERAL SPEED 2.4 m/s, RUNNING DISTANCE 5,000 m)

FIG.18

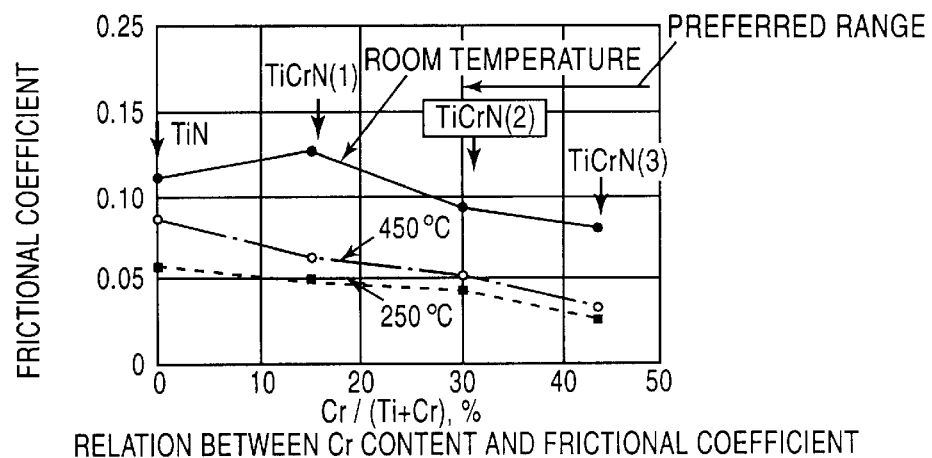

RELATION BETWEEN Cr CONTENT AND FRICTIONAL COEFFICIENT

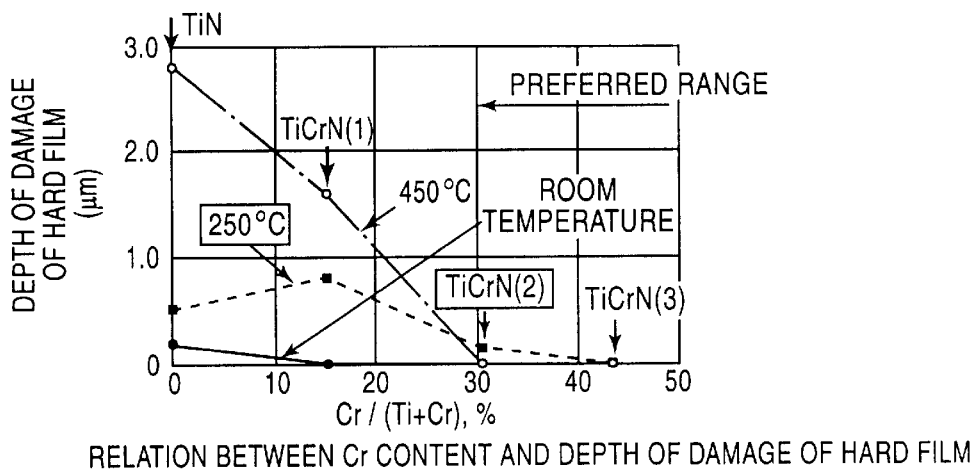

RELATION BETWEEN Cr CONTENT AND DEPTH OF DAMAGE OF HARD FILM

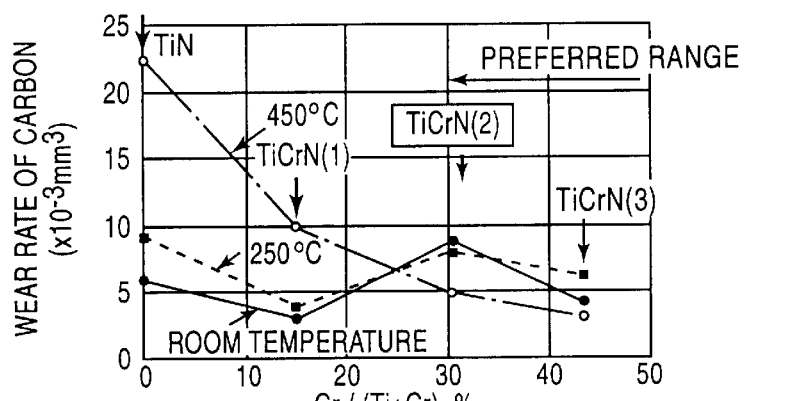

RELATION BETWEEN Cr CONTENT AND WEAR RATE OF CARBON

FRICTIONAL WEAR CHARACTERISTICS OF SUS 420J2 STEELS
COATED WITH Ti-Cr-N FILMS
FRICTIONAL WEAR TEST CONDITIONS: SURFACE PRESSURE 0.8 MPa, PERIPHERAL
SPEED 2.4 m/s, RUNNING DISTANCE 5,000 m, ATMOSPHERE - WATER VAPOR

CR-CONTAINING TITANIUM NITRIDE FILM

BACKGROUND OF THE INVENTION

The present invention relates to a Cr-containing titanium nitride film having an excellent wear resistance and a low frictional coefficient. More specifically, it relates to a Cr-containing titanium nitride film suitable for a slide member such as a bearing or a seal used in rotary machines operated at a high temperature, such as a steam turbine and a gas turbine.

In order to increase a wear resistance or a corrosion resistance of a bearing or seal member formed of a metallic material, application of a ceramic coating to its surface has been widely conducted. Examples of a material used in the ceramic coating include titanium nitride (TiN), titanium carbide (TiC), chromium nitride (CrN), boron nitride (BN) and diamond-like carbon (DLC). Of these, TiN and CrN have been already widely industrialized, and have been used in a mold and a cutting tool as a hard film.

As a method for forming such a hard film, a surface modification technique such as an ion plating method typified by a PVD method or a CVD method, a sputter deposition method, a plasma CVD method or an ion implantation method has been studied. Especially, a dynamic mixing (DM) method which is a combination of a vacuum deposition method and an ion implantation technique has attracted much interest as a film-forming technique which provides an excellent adhesion with a substrate and enables formation of a product at a low temperature.

Titanium-nitride (TiN), one of ceramic coating materials which have been widely used is known to be a typical substance that forms an interstitial compound having a face-centered cubic crystal structure. In TiN, nitrogen enters a Ti lattice as an interstitial solid solution to give an NaCl-type crystal structure. $TiN_x$ can take a wide composition zone of $0.8<x<1.16$. It is known that when x is varied within this composition zone, a lattice constant of TiN is changed. Since a TiN film is excellent in wear resistance and corrosion resistance, it has been used in some bearing or seal members.

By the way, in rotary machines operated at a high temperature, such as a steam turbine and a gas turbine, the development of a hard film having an excellent wear resistance, an excellent high-temperature corrosion resistance and a high slidability has been in demand with the increase in operation temperature of rotary machines. A Ti film is considered to be employed in this use. However, it has been found from the past experiments that when a TiN film is exposed to a high-temperature atmosphere or a high-temperature water vapor, a high-temperature corrosion resistance of TiN itself is not satisfactory and is problematic in durability. Accordingly, the existing TiN film could not have exhibited satisfactory sliding characteristics in this use.

SUMMARY OF THE INVENTION

The invention has been made to solve these problems, and it aims to provide a Cr-containing titanium nitride film which has an excellent wear resistance and an excellent slidability with a low frictional coefficient and which can be improved in high-temperature corrosion resistance.

In order to attain this aim, the first embodiment of the invention is a Cr-containing titanium nitride film which is composed of a nitride containing Ti and Cr as main components, the crystal particles thereof having a face-centered cubic structure, and the crystal thereof being highly oriented toward (200) face.

For improving the high-temperature corrosion resistance and the oxidation resistance of the titanium nitride film, the present inventors have tried to obtain a nitride thin film containing elements other than Ti and N, and have developed a technology of forming such a nitride thin film. That is, they have conducted investigations on a technology of forming a nitride thin film containing elements other than Ti and N in consideration of improving the high-temperature corrosion resistance of the titanium nitride thin film without impairing the high sliding characteristics (wear resistance, low frictional coefficient) inherent in the titanium nitride thin film. Consequently, it has been found that in a nitride film containing titanium nitride as a main component and further containing Cr, good frictional wear characteristics are exhibited when the crystal structure is a face-centered cubic (fcc) structure and the crystal particles are highly oriented toward (200) face. In this case, the resulting thin film has a Vickers hardness of 2,500 or more.

The second embodiment of the invention is a Cr-containing titanium nitride film, wherein Cr-containing titanium nitride has the following chemical composition, $Ti_{(100-x)}Cr_x$ nitride wherein 30 at.%$<x\leq$60 at.%, and impurities are oxygen and carbon, the content of oxygen or carbon being several at.%.

It is advisable that the Cr-containing titanium nitride film in the first and second embodiments of the invention is formed by a dynamic mixing (DM) method such that nitrogen is ion-implanted while vacuum-depositing Ti as a metallic element and an additional element onto a metallic substrate. This method can form a film having a high adhesion with the substrate and produce a product at a low temperature. It is advisable for maintaining an adhesion to use stainless steel such as an SUS 420J2 steel or an SUS 630 steel, an Ni alloy such as an INCOLOY 909 alloy or a Hastelloy alloy, which has a coefficient of thermal expansion of $11 \times 10^{-6}$ or less, as a substrate.

It is preferable that an accelerating voltage of ion beams is 40 kV or less. When it is more than 40 kV, an ion beam acceleration device becomes large-scaled, inviting high processing costs or requiring a measure against radiation. Further, when an energy of applying ion beams is less than 1 kV, an adhesion with a substrate is insufficient, and a hard film suitable for a high-temperature slide member is not obtained.

From the results of measurement by an X-ray diffraction (XRD) method, it is presumed that the size of crystal particles of the nitride thin film is preferably several nanometers to 100 nanometers. It is advisable that the thickness of the hard film formed is less than several tens of micrometers in consideration of various factors such as processing costs and a residual stress of the film. However, various thicknesses are available according to the usage.

The ratio of the additional element (Cr) can be determined by controlling the evaporation rates of Ti and the additional element (Cr) in the DM method. In TiN, nitrogen enters a Ti lattice as an interstitial solid solution, and a face-centered cubic crystal structure is provided. The crystal particles can be oriented toward (200) face by controlling the irradiation conditions of nitrogen ion beams, for example, an accelerating voltage of ion, a current density, an application energy (W/cm²) and an irradiation angle in the DM method. As the Cr content is increased, the crystal is highly oriented toward TiN (200) face.

The third embodiment of the invention is a process for producing the Cr-containing titanium nitride film in the first or second embodiment of the invention, which comprises vacuum-depositing Cr and Ti on a substrate simultaneously, and applying ion beams made mainly of nitrogen to form Cr-containing titanium nitride.

The fourth embodiment of the invention is a slide member comprising a combination of a movable member and a stationary member, one of the movable member and the stationary member being made of a metal, and the other being made of a carbon-containing material, wherein the Cr-containing titanium nitride film in the first or second embodiment of the invention is formed on the slide surface of the movable member or the stationary member made of the metal.

The invention is specifically described below by referring to the drawings. The following description is directed to one specific mode of the invention, and the invention is not limited thereto.

BRIEF DESCRIPTION OF THE DRAWINGS

FIG. 6 is a view showing a spectrum of Cr2p of an oxide layer formed on a TiCrN (3)-coated member after a test of exposure to a high-temperature water vapor.

FIG. 7 is a view showing a spectrum of Ti2p of an oxide layer formed on a TiCrN (3)-coated member after a test of exposure to a high-temperature water vapor.

FIG. 8 is a schematic view showing a high-temperature atmosphere wear test apparatus.

FIG. 9 is a view showing results obtained by measuring frictional wear characteristics at room temperature and 450° C. using a combination of a DM-Tin, DM-characteristics of a TiN-coated 420J2 steel in a high-temperature atmosphere at 450° C.

FIG. 18 is a view showing results obtained by measuring frictional wear characteristics at room temperature and a high-temperature water vapor at 250° C. or 450° C. using a combination of an SUS (420J2 steel coated with conventional TiN or TiCrN (1), TiCrN (2) or TiCrN (3) of the present invention and carbon of light temperature.

In FIGS. 1, 3, 8 and 19, reference numerals show the following members.

11 is a film-forming chamber; 12 a holder, 13, 14 evaporation sources; 13a, 14a filaments; 15 an ion source; 16 a rotary shaft; 17 a trap; 18 a case; 19 an oven; 20 a water vapor generator; W a substrate; 31 a rotary ring; 32 a holder for a rotary ring; 34 a stationary ring; 35 a holder for a stationary ring; 38 a thermocouple for measuring a temperature of a test piece; 39 a thermocouple for measuring a temperature of an atmosphere; 51 a seal housing; 52 a rotary shaft; 53 a shaft sleeve; 58 a key; 55 a rotary ring; 56 a stationary ring; 57 a pin; 58 a seal ring retainer; 59 a spring; 60 a lock plate; and 61 a shearing key, respectively.

DETAILED DESCRIPTION OUT THE INVENTION

Figure 1:
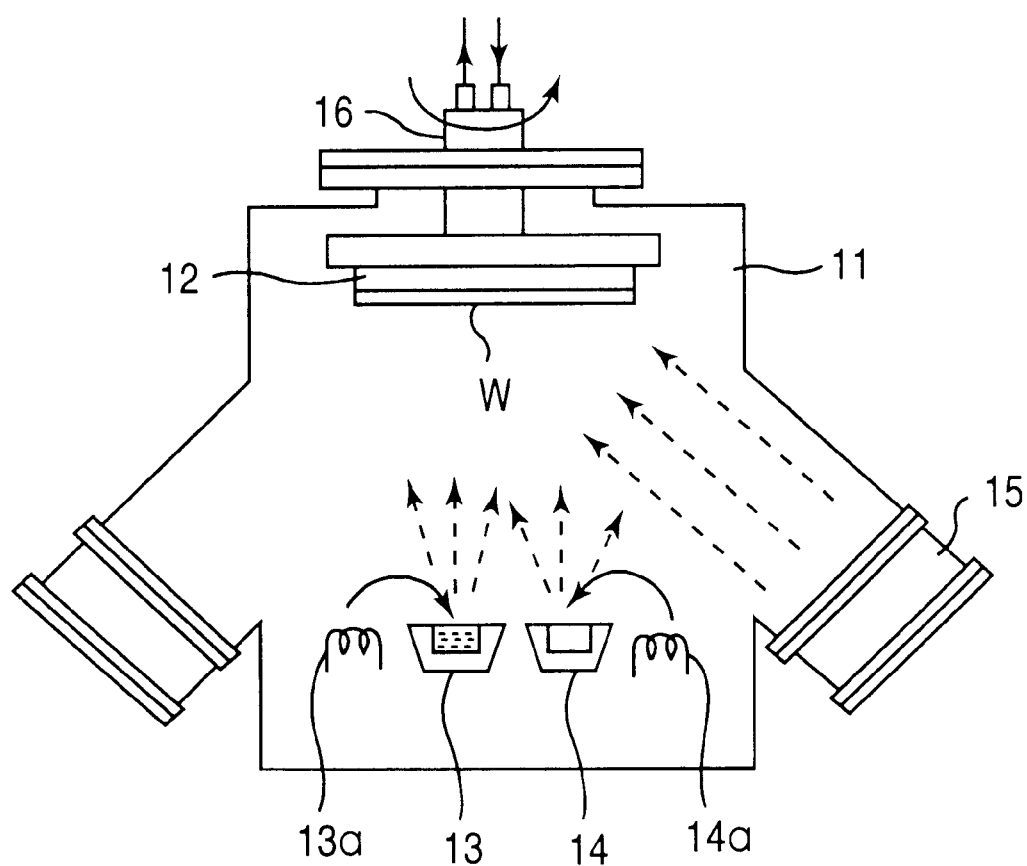
FIG. 1 is a conceptual view showing a structure of a dynamic mixing (DM) apparatus.

FIG. 1 is a schematic view showing a structure of a dynamic mixing (DM) apparatus. The dynamic mixing apparatus provided in an air-tight film-forming chamber 11 with a holder 12 made of copper on which lower surface a substrate W is held, evaporation sources 13, 14 having filaments 13a, 14a located below the holder and an ion source 15 capable of applying ions to the substrate W obliquely from below. The holder 12 made of copper is adapted to be rotated with a rotary shaft 16 for uniformly forming a film on the surface of the substrate W, and is cooled with water via the rotary shaft 16 for preventing the increase in the temperature of the substrate W by applying ion beams.

The substrate material was coated with a hard film using the apparatus shown in FIG. 1. As the substrate material, an SUS 420J2 steel (stainless steel) and an INCOLOY 909 alloy (Ni based alloy) were used. The chemical composition of the substrate materials and the heat treatment conditions are shown in Tables 1 and 2. A test piece having a length of 30 mm, a width of 20 mm and a thickness of 1 mm was used to evaluate properties of each hard member formed, and a ring-like test piece (rotary ring; outer diameter 35 mm, inner diameter 15 mm, thickness 7 mm; stationary ring; outer diameter 35 mm, inner diameter 23.5 mm, thickness 10 mm) was used in a frictional wear test in a high-temperature atmosphere and a high-temperature water vapor. Each substrate material was lapped until the surface roughness Ra was within 0.05 µm, ultrasonically cleaned with acetone, and then installed on the holder 12 of the DM apparatus in FIG. 1.

TABLE 1

Chemical composition of SUS 420J2 steel and heat treatment conditions

| C | Si | Mn | P | S | Cu | Ni | Cr | Nb | Fe |
|---|----|----|----|----|----|----|----|----|----|
| 0.40 | 0.29 | 0.95 | 0.029 | 0.009 | 3.32 | 4.29 | 15.69 | 0.38 | balance |

Heat treatment conditions: retained at 960° C. for 1 hour (cooled with oil) → retained at 650° C. for 1 hour (cooled with air)

TABLE 2

Chemical composition of INCOLOY 909 alloy and heat treatment conditions

| C | Mn | Fe | S | Si | Cu | Ni | Cr | Al | Ti | Co | P | B |
|---|---|---|---|---|---|---|---|---|---|---|---|---|
| 0.01 | 0.02 | 41.07 | 0.001 | 0.44 | 0.10 | 38.47 | 0.09 | 0.03 | 1.56 | 13.04 | 0.005 | 0.002 |

Heat treatment conditions: retained at 980° C. for 1 hour (cooled with air) → retained at 720° C. for 8 hours (cooled in oven) → retained at 620° C. for 8 hours (cooled with air)

First, the inside of the film-forming chamber 11 was evacuated until the pressure reached $5\times10^{-5}$ Pa or less, and a substrate was irradiated with nitrogen ion beams at an accelerating voltage of 10 kV, an ion current density of 2.0 A/m$^2$ and an irradiation angle of 45° for an irradiation time of 300 seconds to conduct sputter cleaning of the substrate surface. Subsequently, while the surface of the substrate was irradiated with nitrogen beams from a nitrogen ion beam source 15 with control of a current density, Ti and an additional element (Cr) were evaporated from steam sources 13, 14. A film was formed under film-forming conditions shown in Table 3 while controlling the evaporation rates thereof. The deposition rates of Ti and Cr were monitored with a quartz oscillator-type film thickness meter. In the experiment, a Ti-Cr-N hard film was formed to a film thickness of approximately 4 μm while amount of nitrogen ions implanted (ion current density: 2.0 A/m$^2$) was kept constant and the evaporation rates of Ti and Cr were varied.

TABLE 3

Film-forming conditions

| Nitrogen ion beams | |
|---|---|
| Accelerating voltage | 10 kV |
| Current density | 2.0 A/m$^2$ |
| Irradiation angle | 45° |
| Evaporated atoms | |
| Ti | ~2.0 nm/s |
| Cr | ~2.0 nm/s |

The composition of the hard film formed was analyzed by X-ray photoelectron spectroscopy (XPS). The analysis conditions are shown in Table 4. The crystal orientation, the lattice spacing and the lattice constant of the hard film were measured by an X-ray diffraction method (0–20 method using CuKα rays). Further, the crystal face was identified according to JCPDS PDF card.

TABLE 4

XPS analysis conditions

| | |
|---|---|
| X-ray source | Al-Kα |
| Depth of measurement | Approximately 4 nm |
| Measurement region | diameter 100 μm |
| Neutralization gun | used |
| Sputtering | Ar ion (sputtering rate 23 nm/min) |
| Sputtering region | diameter 1 mm |

The film thickness was measured by observing the section of the film with a scanning electron microscope (SEM). The hardness of the film was measured with a micro-Vickers hardness meter. The load was 5 to 25 g.

Figure 2:
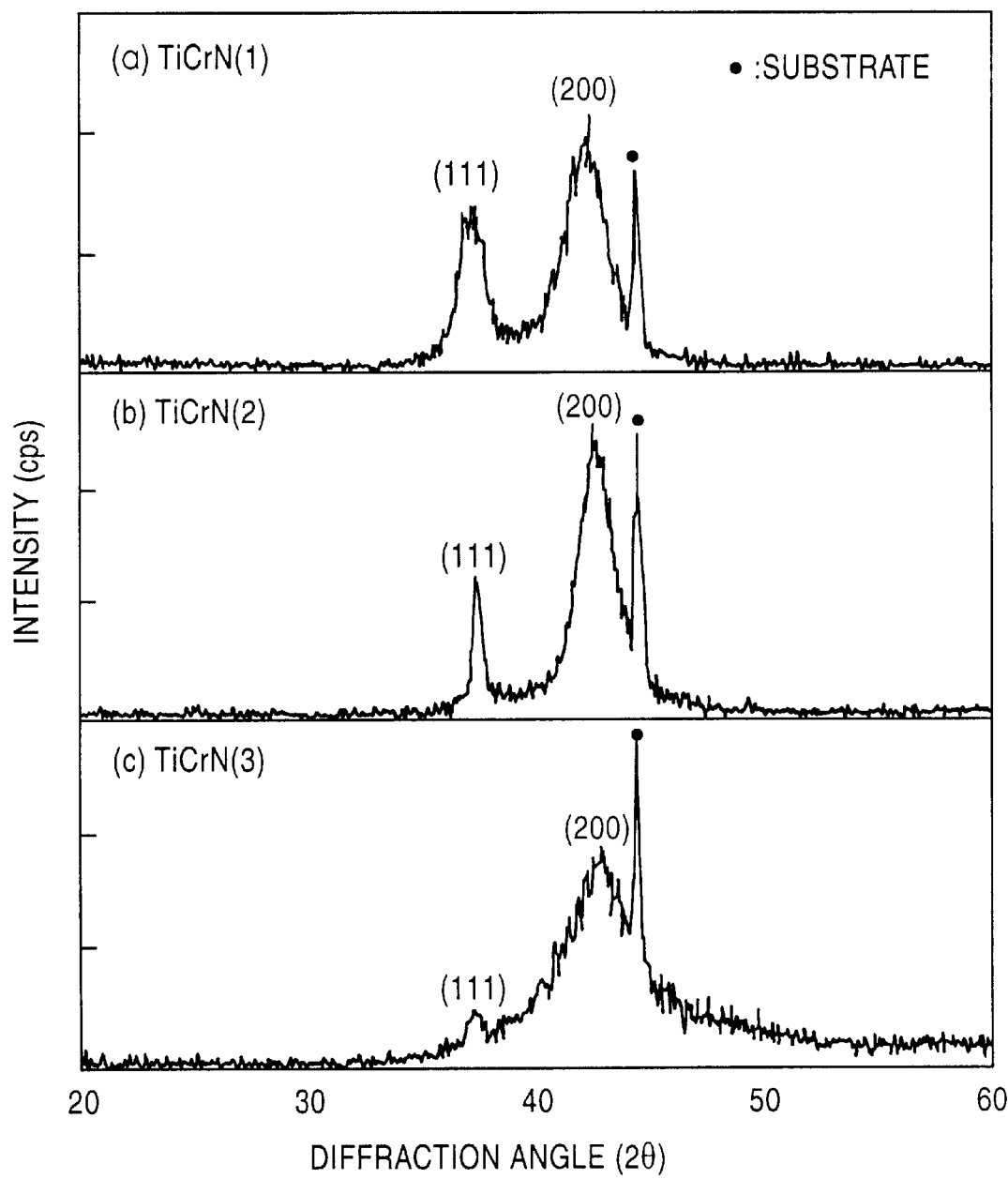
FIG. 2 is a view showing an X-ray diffraction pattern of TiCrN (1), TiCrN (2) and TiCrN (3).

The composition, the crystal structure, the crystal orientation and the Vickers hardness of each of TiN (reference example), Ti-Al-N (reference example) and Ti-Cr-N (present invention) hard films formed by the dynamic mixing (DM) method were measured, and the results are shown in Table 5. The analysis of the composition shown in Table 5 was conducted by XPS after sputter cleaning with argon ions. The X-ray diffraction pattern of TiCrN (1), TiCrN (2) and TiCrN (3) is shown in FIG. 2. TiCrN (1), TiCrN (2) and TiCrN (3) have the same face-centered cubic crystal structure as the TiN film, and peaks diffracted in TiN (111) and TiN (200) are observed. There is a tendency that as the Cr content is increased, the crystal is highly oriented toward TiN (200) face and this diffraction peak is widened. TiCrN (3) has the highest Vickers hardness, 3,300, as compared with TiCrN (1) and TiCrN (2). TiAlN (1), TiAlN (2) and TiAlN (3) have the same face-centered cubic crystal structure as the TiN film, and peaks highly diffracted in TiN (111) are observed (not shown). TiAlN (3) has the highest Vickers hardness, 3,500.

TABLE 5

Composition and hardness of TiN, and TiAlN and TiCrN films

| | Composition[1] | | | | Crystal | Crystal orientation | Vickers hardness[2] |
|---|---|---|---|---|---|---|---|
| Hard material | Ti | Al | Cr | N | structure | face | Hv |
| DM-TiAlN (1)[3] | 56 | 9 | — | 35 | fcc[4] | (111) | 2,500 |
| DM-TiAlN (2) | 56 | 12 | — | 24 | fcc | (111) | 3,300 |
| DM-TiAlN (3) | 57 | 19 | — | 24 | fcc | (111) | 3,500 |
| DM-TiCrN (1) | 55 | — | 10 | 35 | fcc | (200) | 2,500 |
| DM-TiCrN (2) | 44 | — | 19 | 36 | fcc | (200) | 2,900 |
| DM-TiCrN (3) | 34 | — | 26 | 40 | fcc | (200) | 3,300 |
| DM-TiN | 56 | — | — | 44 | fcc | (111) | 3,500 |

Figure 3:
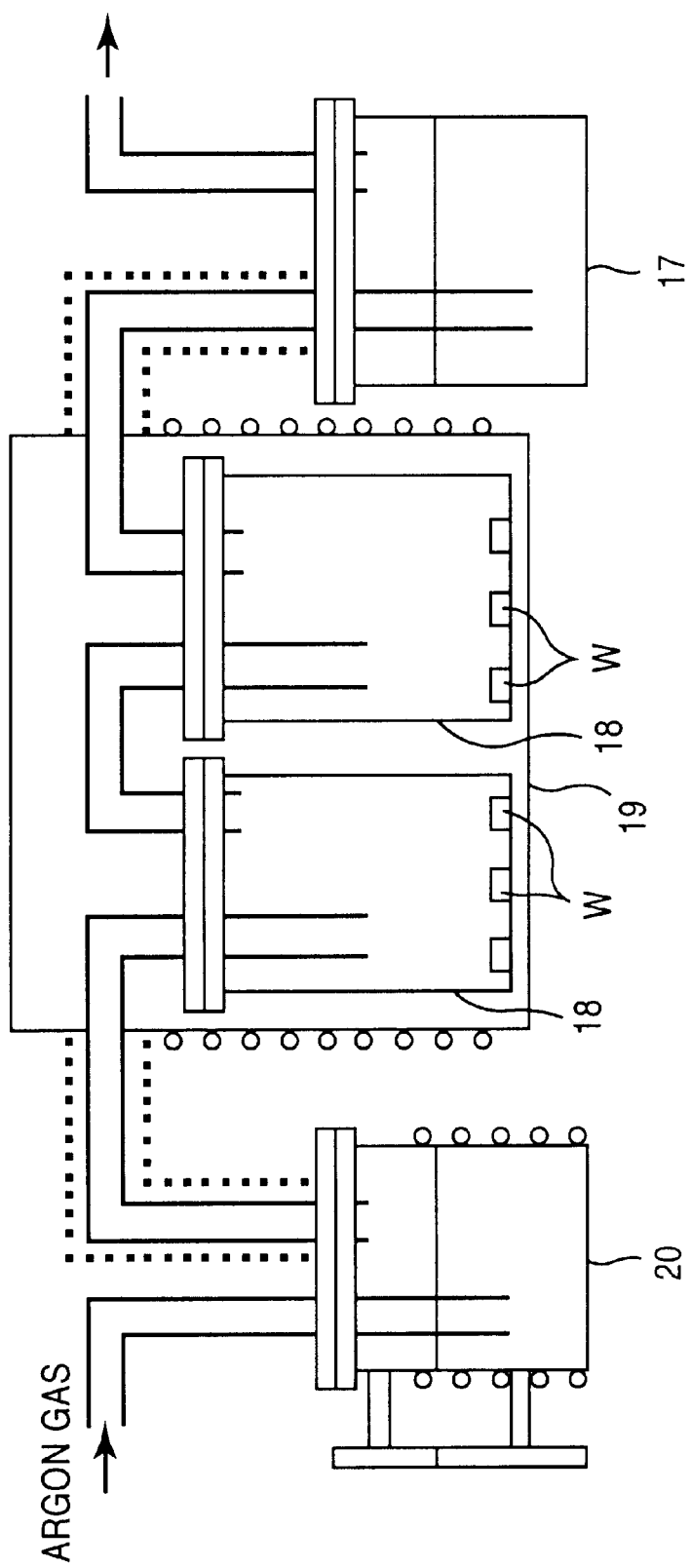
FIG. 3 is a schematic view showing a structure of a high-temperature water vapor exposure test apparatus.

[1]Results of analysis by XPS
[2]Average value of five points measured with a micro-Vickers hardness meter
[3]DM = dynamic mixing method
[4]fcc = face-centered cubic FIG. 3 is a schematic view of a high-temperature water vapor exposure test apparatus. The high-temperature water vapor exposure test apparatus comprises a trap 17, a case 18 formed of a stainless steel closed container holding a test piece W, an oven 19 formed of an electric oven that keeps the case 18 at a predetermined temperature, and a water vapor generator 20 for supplying a water vapor to the oven 19. In order to measure a high-temperature corrosion resistance of SUS 420J2 steels coated with the hard films, the test piece W was set in the case 18 capable of keeping the temperature constant with the oven 19, and a water vapor was continuously fed from the water vapor generator 20 to the case 18. The conditions for the high-temperature water vapor exposure test are shown in Table 6. The influence of a time of exposure to the water vapor on a thickness of an oxide layer formed after the exposure was examined by maintaining the test temperature at 450° C. and varying the test time (50 hrs, 300 hrs and 1,000 hrs). The corrosion condition of the exposure surface after the high-temperature water vapor exposure test was observed with an optical microscope and a scanning electron microscope (SEM).

TABLE 6

Conditions for high-temperature water vapor exposure test

| Atmosphere | Water vapor |
| --- | --- |
| Test temperature | 450 ± 5° C. |
| Test time | 50 hrs, 300 hrs, 1.000 hrs |
| Amount of water vapor | 1.4 ml/min |

After the high-temperature water vapor exposure test, the exposure surface was observed with an optical microscope and a scanning electron microscope. Consequently, the corrosion surface was smooth, and crack or peel of the coated member was not observed.

The hard film after the high-temperature water vapor exposure test was subjected to sputtering with Ar ion beams for a fixed period of time to reduce the film thickness, and the composition and the condition of the surface were analyzed by X-ray photoelectron spectroscopy (XPS).

Figure 4:
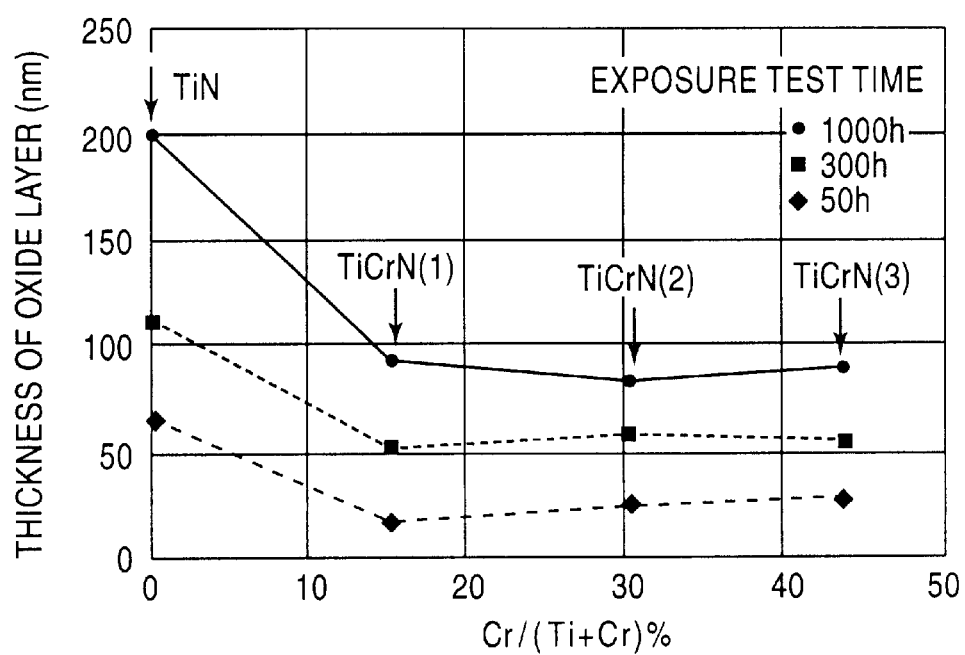
FIG. 4 is a view showing results of examining an influence of a Cr content on a thickness of an oxide layer formed after a test of exposure to a high-temperature water vapor (test temperature 450° C.).

The influence of a Cr content on a thickness of an oxide layer formed after the high-temperature water vapor exposure test (test temperature 450° C.) was examined, and the results are shown in FIG. 4. In FIG. 4, the abscissa represents the Cr content (%), and the ordinate the thickness (nm) of the oxide film formed respectively. The elemental analysis was conducted in the depth direction by XPS, and the thickness of the oxide layer in FIG. 4 was obtained as a depth in which the maximum concentration of oxygen was halved. FIG. 4 reveals that in comparison with the conventional TiN film, the TiCrN film of the present invention is decreased in thickness of the oxide layer formed after the high-temperature water vapor exposure test and is therefore excellent in resistance to corrosion with high-temperature water vapor.

Figure 5A:
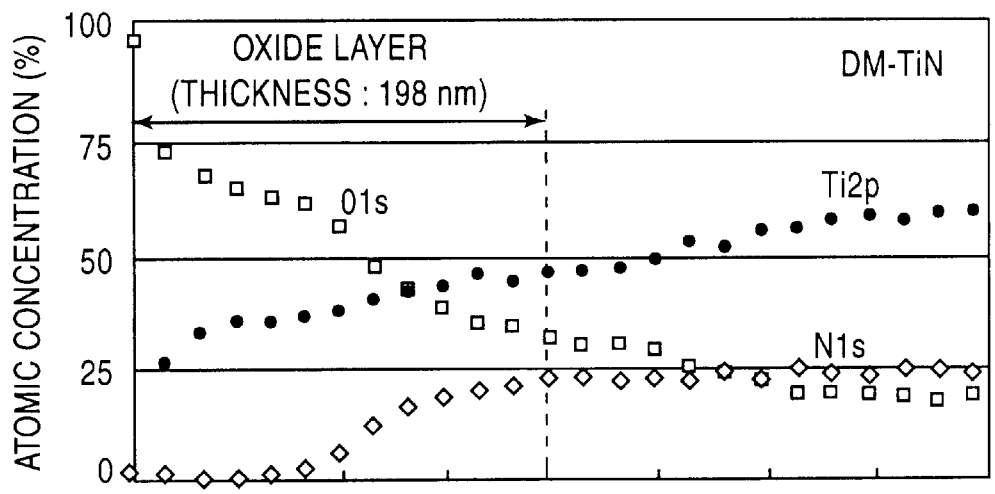
FIG. 5(a) shows the results of DM-TiN, and FIG. 5(b) the results of DM-TiCrN (3) respectively.
Figure 5B:
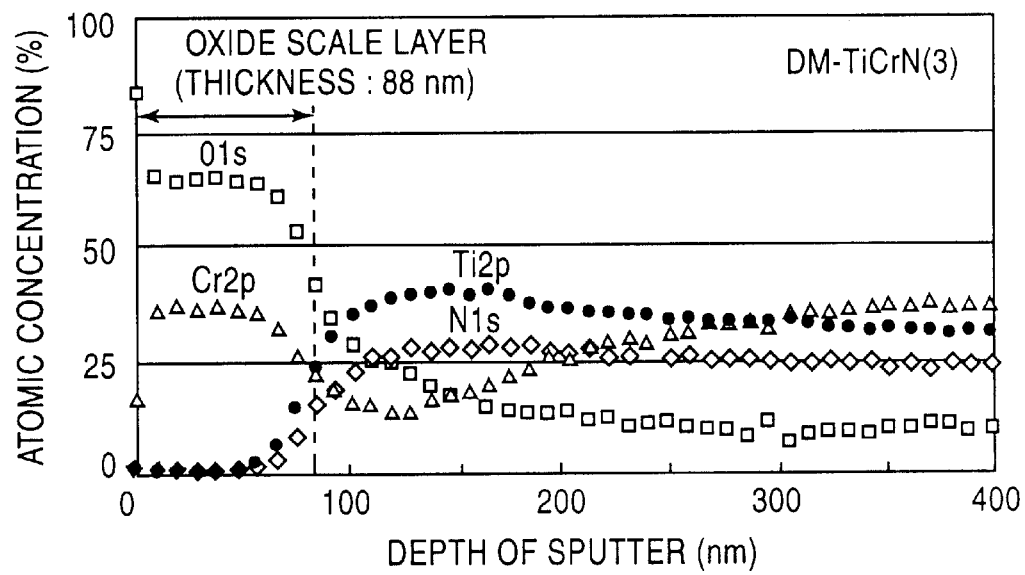
FIG. 5 is a view showing results of depth-direction XPS elemental analysis of a corrosion layer formed on DM-TiN or DM-TiCrN (3) after a test of exposure of a high-temperature water vapor.

The results of the XPS elemental analysis in the depth direction of the corrosion layer formed on the DM-TiN or TiCrN (3) hard film after the high-temperature water vapor exposure test are shown in FIG. 5. FIG. 5(a) shows the results of DM-TiN, and FIG. 5(b) the results of DM-TiCrN (3) respectively. In FIGS. 5(a) and 5(b), the abscissa represents the depth of sputter (nm), and the ordinate the atomic concentration (%) respectively. Compared with DM-TiN (conventional), TiCrN (3) of the present invention is found to be decreased in thickness of the oxide layer. In case of TiCrN (3), it is considered that only Cr and oxygen are present in the outermost layer, a spectrum ascribable to Ti2p is absent and the Cr oxide is formed.

Figure 6A:
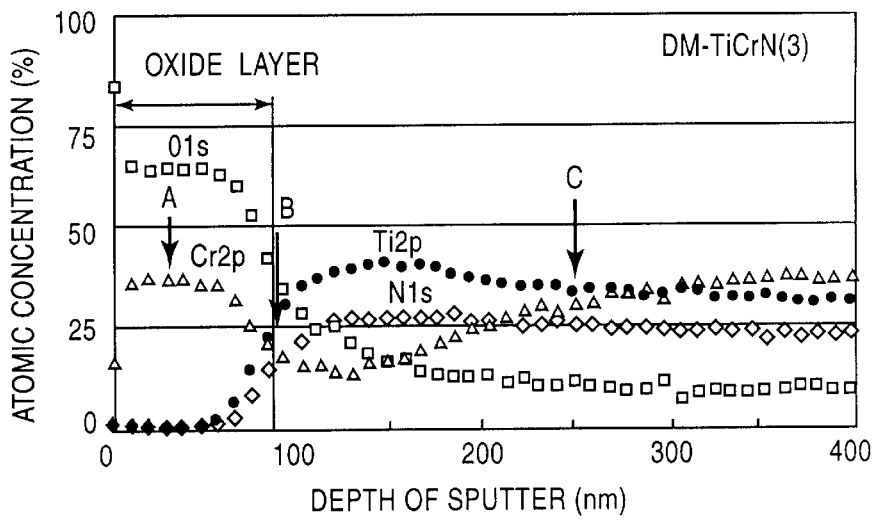
In FIG. 6(a), the abscissa represents a depth of sputter (nm), and the ordinate an atomic concentration (%) respectively.
Figure 6B:
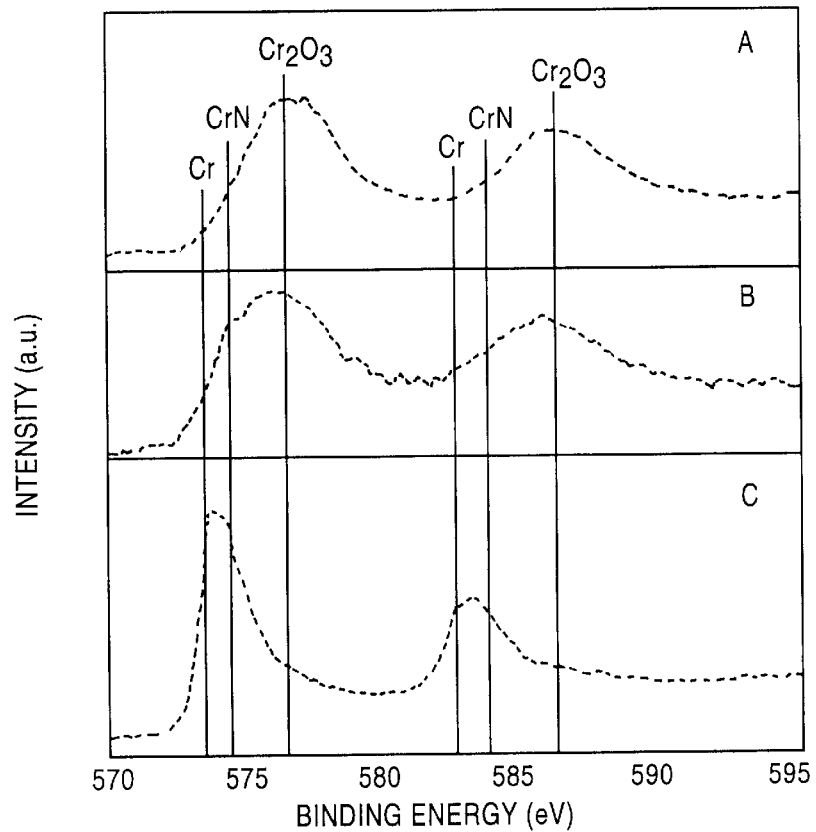
FIG. 6(b) shows a spectrum in points A, B and C in FIG. 6(a).
Figure 7A:
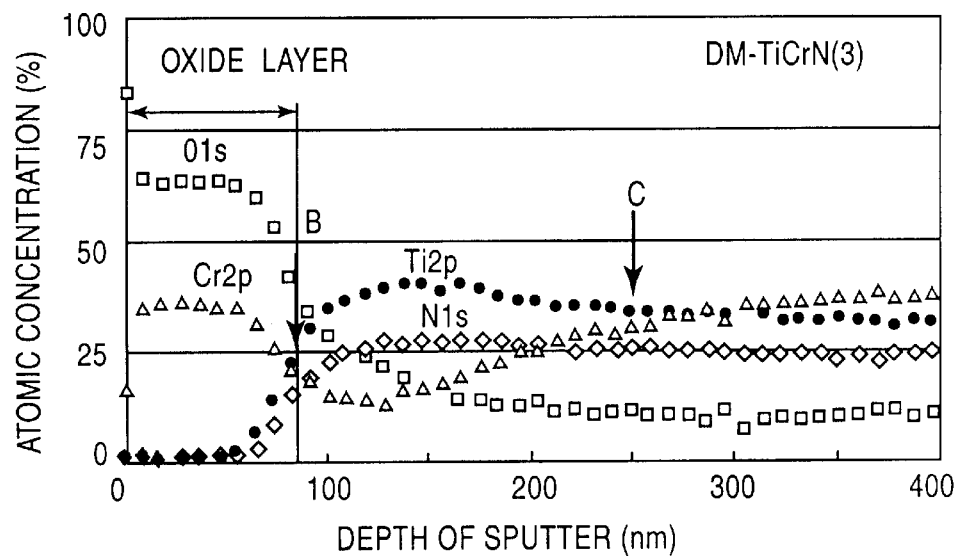
In FIG. 7(a), the abscissa represents a depth of putter (nm), and the ordinate an atomic concentration (%) respectively.
Figure 7B:
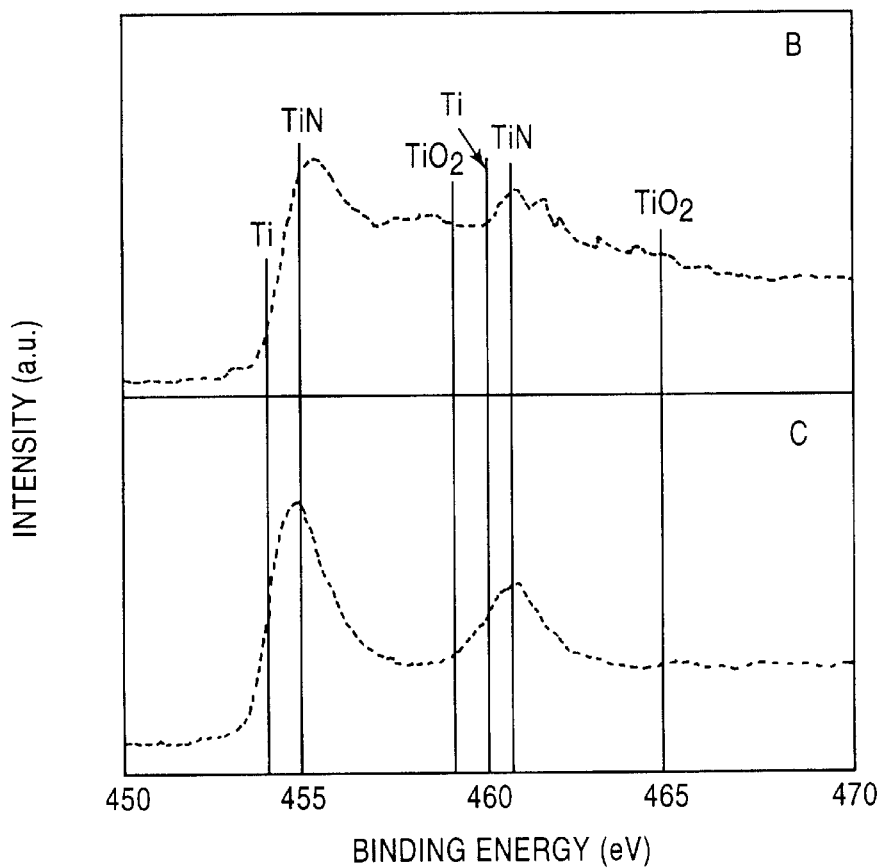
FIG. 7(b) shows a spectrum in points A, B and C in FIG. 7(a).

Spectra of Cr2p and Ti2 of the oxide layer formed on the TiCrN (3)-coated member after the high-temperature water vapor exposure test are shown in FIGS. 6 and 7. In FIG. 6(a), the abscissa represents the depth of sputter (nm), and the ordinate the atomic concentration (%) respectively. FIG. 6(b) shows a spectrum in points A, B and C of FIG. 6 (a). Likewise, In FIG. 7(a), the abscissa represents the depth of sputter (nm), and the ordinate the atomic concentration (%) respectively, and FIG. 7(b) shows a spectrum in points A, B and C of FIG. 7 (a). In the spectrum of Cr2p near 20 nm (point A) from the outermost layer, peaks are observed in 576.3 eV and 578.1 to 579.8 eV (energy corresponding to $Cr_2O_3$) (FIG. 6(b)-A), and $Cr_2O_3$ is considered to be present on the outermost layer. In the spectrum of Cr2p near 90 nm (point B) from the outermost layer, a peak is observed in 576.3 eV (energy corresponding to $Cr_2O_3$), and a shoulder is observed in 574.6 eV (energy corresponding to CrN) (FIG. 6(b)-B). Consequently, it is presumed that $Cr_2O_3$ and CrN (partially) are present. Further, in the spectrum of Ti2p, a peak is shifted from 454.8 eV (energy corresponding to TiN) to a high-energy side (FIG. 7(b)-B). This is presumably results, it is considered that the addition of Cr leads to the formation of the Cr oxide on the outermost layer and improves the oxidation resistance of TiN.

The frictional wear test was conducted in two atmospheres, namely, a high-temperature atmosphere and an atmosphere of high-temperature water vapor by mutually sliding each of a ring-like test piece of the substrate materials having various hard films formed thereon and a carbon ring for high temperature at a fixed sliding rate and a pushing surface pressure. FIG. 8 is a schematic view of a high-temperature atmosphere wear test apparatus. The high-temperature atmosphere wear test apparatus comprises a holder 32 for a rotary ring that holds a rotary ring 31 made of a hard film coated material and a holder 35 for a stationary ring that holds a stationary ring 34 made of carbon for high temperature. The holder 32 for the rotary ring is rotatable by being connected with a motor (not shown), and a load is exerted on the holder 35 for the stationary ring. A thermocouple 38 for measuring a temperature of a test piece is mounted adjacent to the holder 35 for the stationary ring, and a thermocouple 39 for measuring a temperature of an atmosphere is mounted adjacent to the holder 32 for the rotary ring. The conditions for the sliding test at the high-temperature atmosphere are shown in Table 7. Further, the high-temperature atmosphere wear test apparatus is, as shown in FIG. 8, so adapted that a high-temperature water vapor can be fed around the slide surfaces of the rotary ring 31 and the stationary ring 34. The high-temperature water vapor frictional wear test was conducted with this apparatus under sliding conditions shown in Table 7 except the atmosphere was changed to the water vapor. A frictional force of the test piece was measured with a torque meter (not shown). A frictional coefficient $\mu$ was calculated from a torque T by a frictional force using formula (1) on condition that the slide surface uniformly supported a load W.

$$\mu = 3\ ST/2\ \pi W\ (r_1^3 - r_2^3) \tag{1}$$

wherein S represents a slide area, $r_1$ and $r_2$ represent an outer diameter and an inner diameter of a slide portion, T represents a torque, and W represents a pushing load.

Further, after the sliding test, the damage condition of the slide surface was observed and measured with an optical microscope and a feeler-type surface roughness meter.

TABLE 7

Conditions for high-temperature atmosphere sliding test

| Test temperature | room temperature, 250° C., 450° C. |
| --- | --- |
| Pushing surface pressure | 0.8 MPa |
| Peripheral speed | 2.4 m/s |
| Running distance | 5,000 m |

The results of the test of frictional wear characteristics in an atmosphere are described below.

The frictional wear characteristics were measured at room temperature and 450° C. using a combination of a SUS 420J2 steel coated with DM-TiN, DM-TiAlN (3) or DM-TiCrN(3) and carbon for high temperature, and the results are shown in FIG. 9. As is apparent from FIG. 9, Cr-containing TiN exhibits almost good frictional wear characteristics. Especially, DM-TiCrN (3) is little worn in the sliding test at room temperature and 450° C., and less attacks carbon, showing the most excellent frictional wear characteristics.

Figure 10:
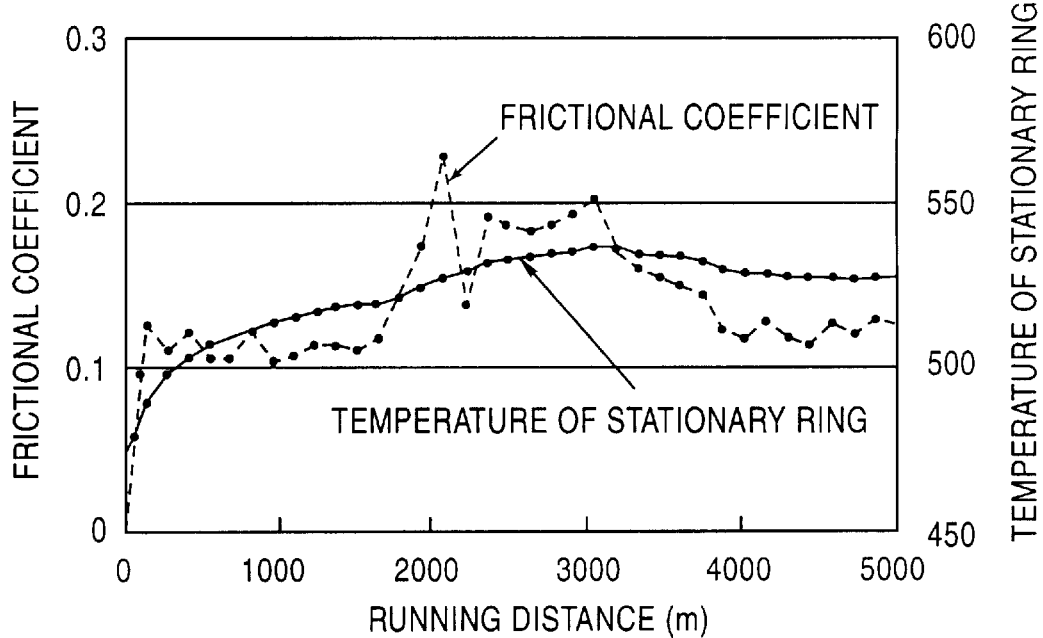
Figure 11:
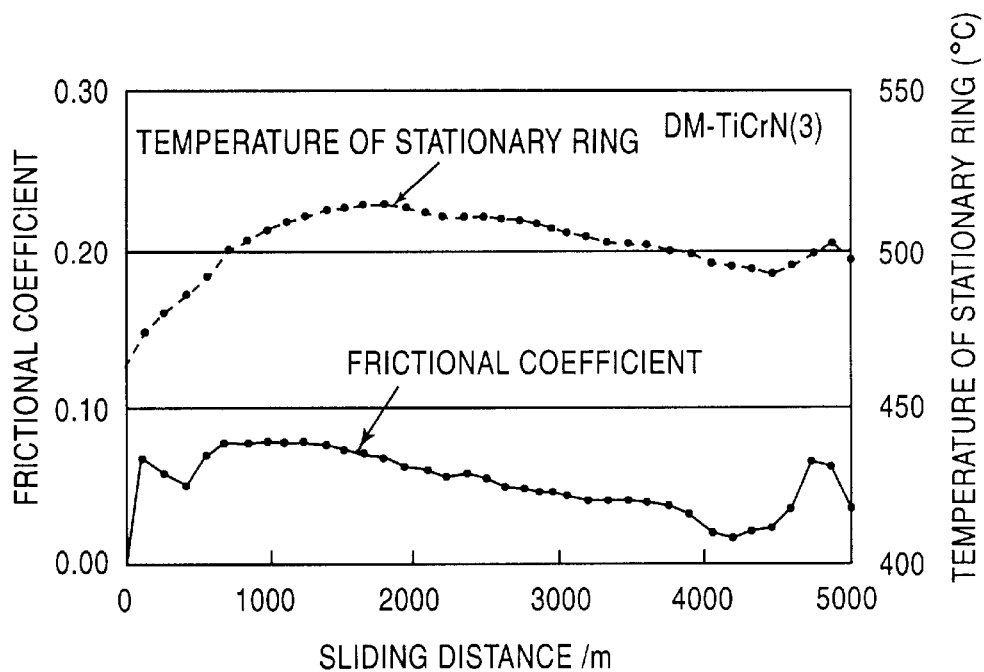
FIG. 11 is a view showing frictional wear characteristics of a DM-TiCrN (3)-coated SUS 420J2 steel in a high-temperature atmosphere at 450° C.

The frictional wear characteristics of the TiN-coated SUS 420J2 steel and the DM-TiCrN (3)-coated SUS 420J2 steel in the high-temperature atmosphere at 450° C. are shown in FIG. 10 and FIG. 11. In the TiN-coated member, the frictional coefficient varies from the running distance of approximately 1,700 m (FIG. 10). Meanwhile, the DM-TiCrN (3)-coated member, compared with the other hand members, exhibits the lowest frictional coefficient ($\mu$=0.03 to 0.08), showing the good frictional wear characteristics (FIG. 11).

Figure 12:
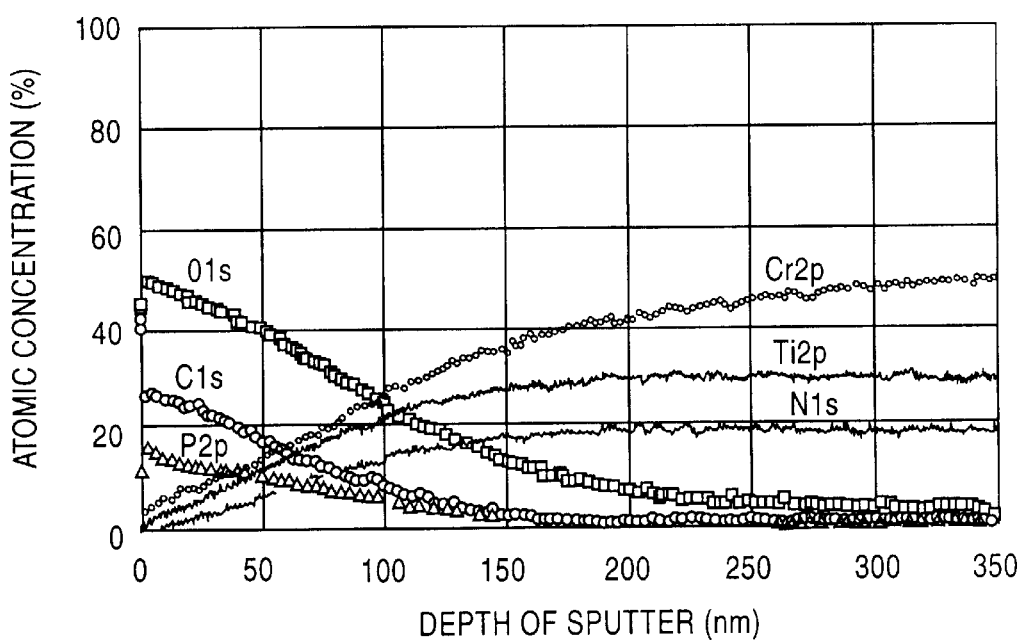
FIG. 12 is a view showing results of XPS analysis in a depth direction of a TiCrN (3 slide surface.

The slide surface of the TiCrN (3)-coated SUS 420J2 steel after the high-temperature atmosphere sliding test at 450° C. was observed with SEM. Consequently, damage such as peel or crack was not observed in the TiCrN (3) coating layer, and the good slide surface was provided. The TiCrN (3) slide surface was analyzed by XPS in the depth direction. The results are shown in FIG. 12. In the outer layer (thickness 0 to 150 nm) of the slide surface, oxygen, carbon and phosphorus were confirmed. It is considered that carbon (constituent elements: carbon, phosphorus) of the opposite piece material is adhered to the oxide outer layer of Ti and Cr formed on the TiCrN (3)-coated member.

Figure 13:
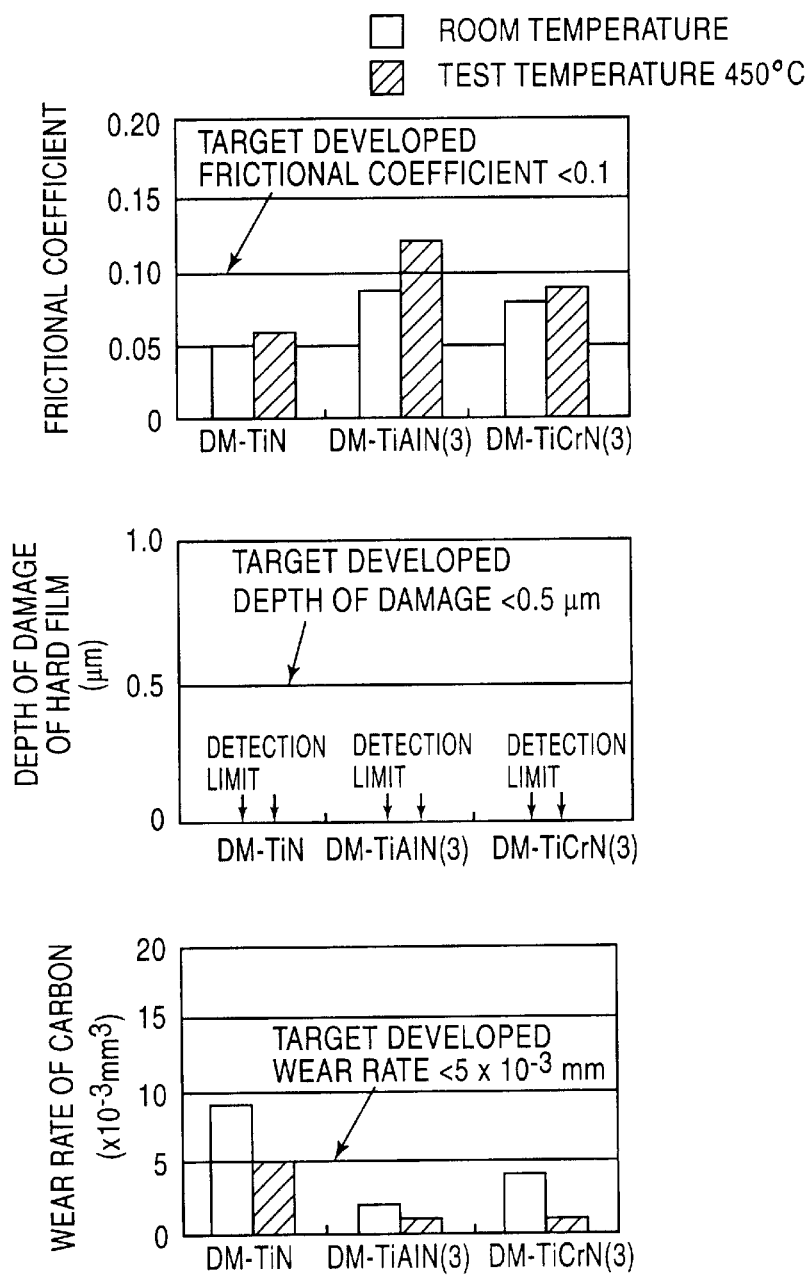
FIG. 13 is a view showing results obtained by measuring frictional wear characteristics at room temperature and in a high-temperature water vapor at 450° C. using a combination of DM-Tin, DM-TiAlN (3) or DM-TiCrN (3)-coated SUS 420J2 steel and carbon for high temperature.

The frictional wear characteristics were measured at room temperature and in a high-temperature water vapor at 450° C. using a combination of an SUS 420J2 steel coated with DM-TiN, DM-TiAlN (3) or DM-TiCrN (3) and carbon for high temperature, and the results are shown in FIG. 13. As is apparent from FIG. 13, the good frictional wear characteristics are exhibited in the high-temperature water vapor at 450° C. Especially in the DM-TiCrN (3)-coated member, the frictional coefficient of <0.1, the film damage depth of <0.5 $\mu$m and the carbon wear rate of <5×10$^{-3}$mm$^3$, which are targets developed, are all satisfied, and the excellent frictional wear characteristics are shown.

Figure 14:
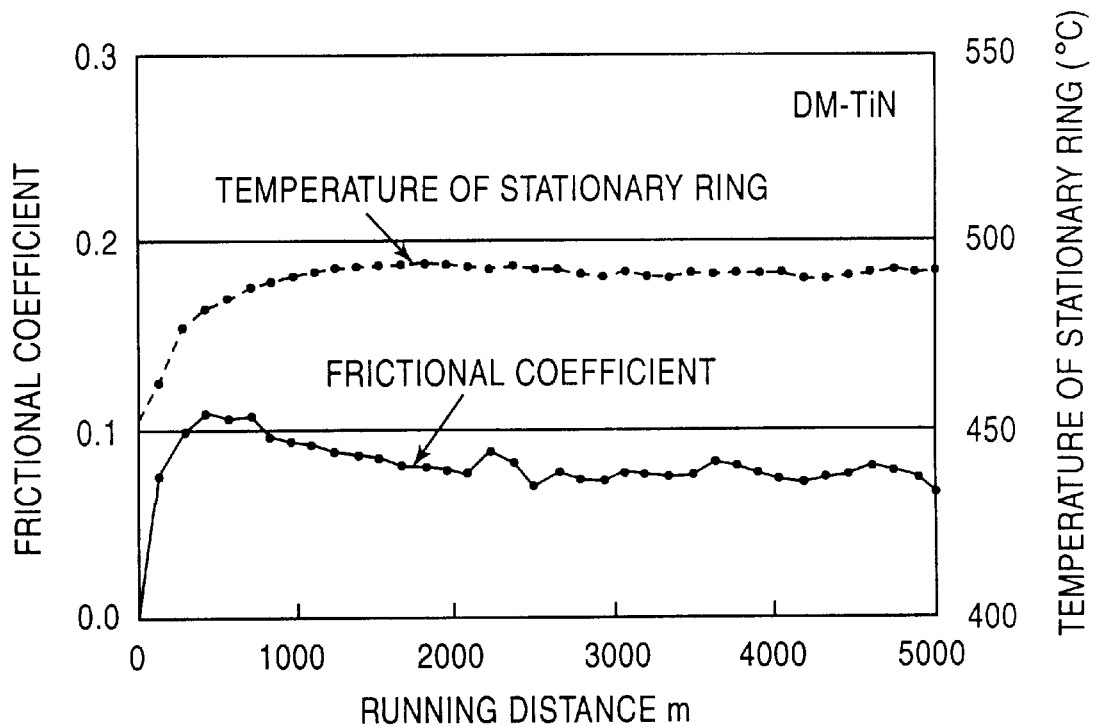
FIG. 14 is a view showing frictional wear characteristics of a TiN-coated SUS 420J2 steel in a high-temperature water vapor at 450° C.
Figure 15:
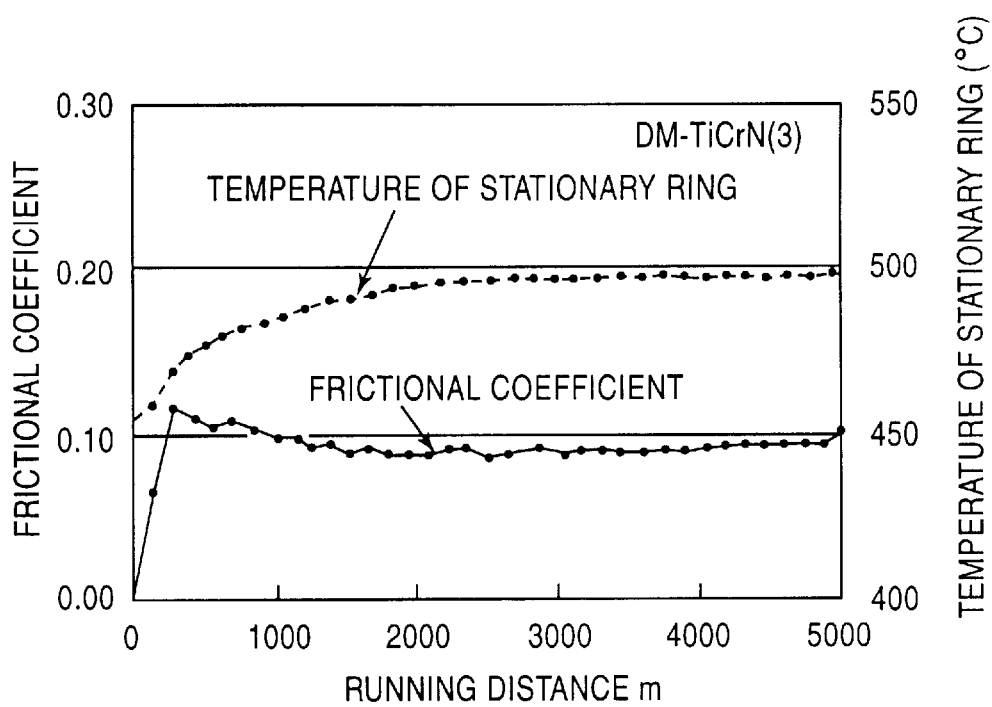
FIG. 15 is a view showing frictional wear characteristics of a DM-TiCrN (3)-coated SUS 420J2 steel in a high-temperature water vapor at 450° C.

The frictional wear characteristics of the TiN-coated SUS 420J2 steel and the DM-TiCrN (3)-coated SUS 420J2 steel in the high-temperature water vapor at 450° C. are shown in FIG. 14 and FIG. 15 respectively. In the TiN-coated member, the frictional coefficient becomes 0.1 or less from the running distance of approximately 800 m, and the stable frictional wear characteristics are shown (FIG. 14). Further, in the DM-TiCrN (3)-coated member, the frictional coefficient becomes 0.1 or less from the running distance of approximately 1,000 m, and the good frictional wear characteristics are shown (FIG. 15).

Figure 16:
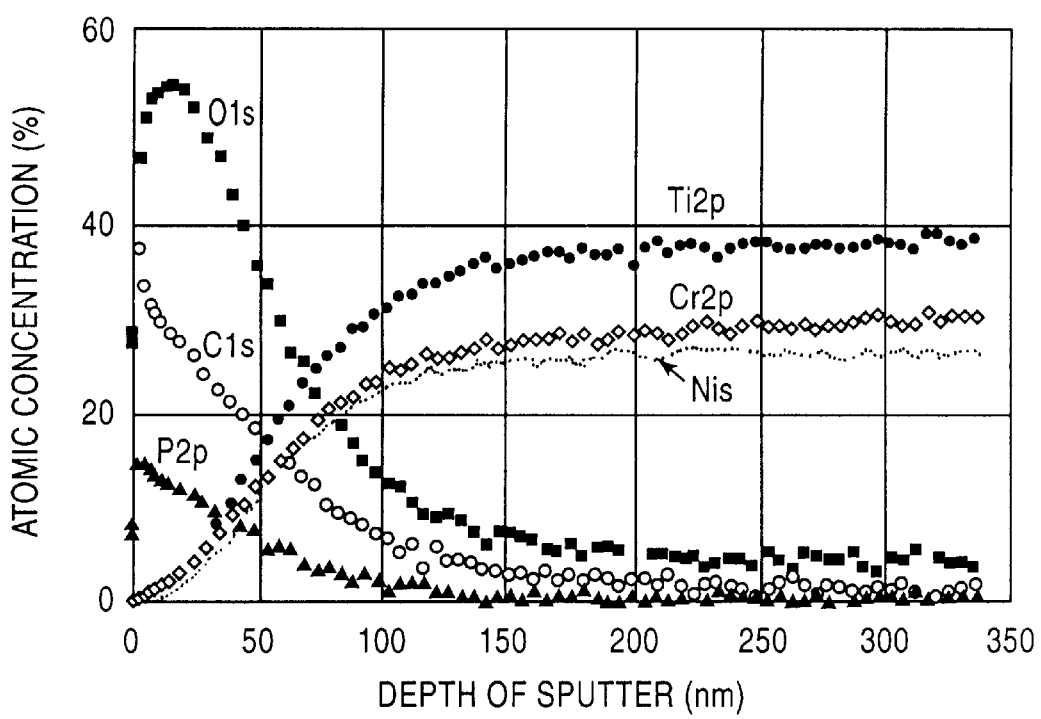
FIG. 16 is a view showing results of XPS elemental analysis in a depth direction of a slide surface of a TiCrN (3)-coated SUS 420J2 steel after a sliding test in a high-temperature atmosphere at 450° C.

The slide surface of the TiCrN (3)-coated SUS 420J2 steel after the high-temperature water vapor sliding test at 450° C. was subjected to elemental analysis by XPS in the depth direction. The results are shown in FIG. 16. In the outer layer (thickness 0 to 100 nm) of the slide surface, oxygen, carbon and phosphorus were confirmed. It is considered that carbon (constituent elements: carbon, phosphorus) of the opposite piece material is adhered to the oxide outer layer of Ti and Cr formed on the TiCrN (3)-coated member as is the case with the results in the frictional wear test in the high-temperature atmosphere.

In view of the foregoing tests, the following conclusions can be drawn.

1. Regarding nitrogen content of Cr-containing titanium nitride

The qualities such as the crystal structure, the crystal orientation and the Vickers hardness of the Cr-containing titanium nitride greatly depend on the nitrogen content. The inventors examined the nitrogen content of Cr-containing titanium nitride by controlling the evaporation rates of titanium and chromium, conditions of nitrogen ion implantation and the pressure during the film formation.

In the present invention, when the nitrogen content was 35 to 40 at.%, Cr-containing titanium nitride had the face-centered cubic crystal structure, and the crystal particles were preferentially oriented toward (200) face. In this case, the Vickers hardness was 2,500 or more. It is considered that the nitrogen content is not limited to the range shown above, and it is sufficient where Cr-containing titanium nitride has the face-centered cubic crystal structure, the crystal particles are highly oriented toward (200) face and the Vickers hardness is 2,500 or more. In consideration of this fact, it is preferably that the nitrogen content is at least 20 at.% and at most 50 at.%.

The crystal structure, the crystal orientation and the Vickers hardness of Ti-Cr-N films according to the present invention are shown in Table 5. The X-ray diffraction pattern of TiCrN (1), TiCrN (2) and TiCrN (3) according to the present invention is shown in FIG. 2. TiCrN (1), TiCrN (2) and TiCrN (3) have the same face-centered cubic crystal structure as the TiN film, and are highly oriented toward TiN (200) face. There is a tendency that as the Cr content is increased, they are preferentially oriented toward TiN (200) face and this diffraction peak is widened.

2. Regarding relation between (200) and frictional wear characteristics

The following frictional wear characteristics are required in the slide member for practical use.

(1) The frictional coefficient is 0.15 or less.
(2) The wear rate of carbon in the opposite piece material is 10×10$^{-3}$mm$^3$ or less.

The conventional Cr-containing titanium nitride is preferentially oriented toward (111) face, and satisfactory frictional wear characteristics capable of enduring the practical use could not be obtained. In the present invention, the relation between the I(200)/I(111) intensity ratio and the frictional wear characteristics were examined, and it was clarified that when the I(200)/I(111) intensity ratio is 1.2 or more, the frictional wear characteristics capable of enduring the practical use are provided. In the present invention, the Cr-containing titanium nitride film preferentially oriented toward (200) face exhibited the excellent frictional wear characteristics. However, the frictional wear mechanism thereof has not been clarified yet.

Figure 17:
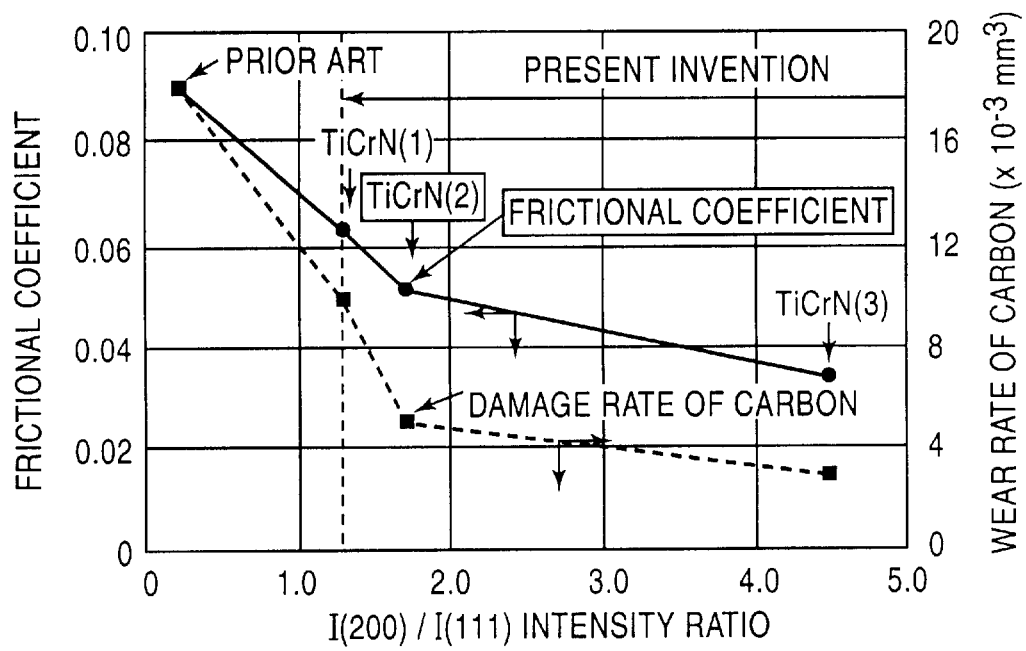
FIG. 17 is a view showing results obtained by measuring a frictional coefficient and a wear rate of carbon in a high-temperature water vapor at 450° C. using a combination of an SUS 420J2 or TiCrN (3) of the present invention and carbon for high temperature.

The frictional coefficient and the wear rate of carbon in the high-temperature water vapor at 450° C. were measured using the combination of the SUS 420J2 coated with conventional TiN or TiCrN (1), TiCrN (2) or TiCrN (3) of the present invention, and the results are shown in FIG. 17.

There is a tendency that as the I(200)/I(111) intensity ratio of XRD is increased, the frictional coefficient and the wear rate of carbon of the opposite piece material are decreased.

3. Regarding relation between Cr content and frictional wear characteristics

The following frictional wear characteristics are required in the slide member for practical use.

(1) The frictional coefficient is 0.15 or less.
(2) The depth of damage of the hard film is 2.0 $\mu$m or less.
(3) The wear rate of carbon in the opposite piece material is 10×10$^{-3}$mm$^3$ or less.

In the Cr-containing titanium nitride film (TiCrN(1)) in which the Cr content ("Cr content" in the following description refers to a Cr/Cr+Ti ratio) was 15 at.%, the depth of damage of the hard film became more than approximately 1.6 $\mu$m. The inventors have clarified that in TiCrN (2) and TiCrN (3) in which the Cr content exceeds 30 at.%, the frictional coefficient, the depth of damage of the film and the wear rate of carbon are decreased greater and they are particularly suitable slide members. It is therefore particularly preferable that the Cr content of the Cr-containing titanium nitride film of the present invention is in the range of 30 to 44 at.%. However the Cr content is not limited to this range so long as Cr-containing titanium nitride has the face-centered cubic crystal structure, the crystal particles are highly oriented toward (200) face and the Vickers hardness is 2,500 or more. In consideration of this face, the Cr content of the Cr-containing titanium nitride film of the present invention is preferably more than 30 at.% and at most 60 at.%, more preferably at most 50 at.%.

The frictional wear characteristics were measured at room temperature and in a high-temperature water vapor at 250° C. or 450° C. using a combination of the SUS 420J2 steel coated with conventional TiN or TiCrN (1), TiCrN (2) or TiCrN (3) of the present invention and carbon, and the results are shown in FIG. 18.

Figure 19:
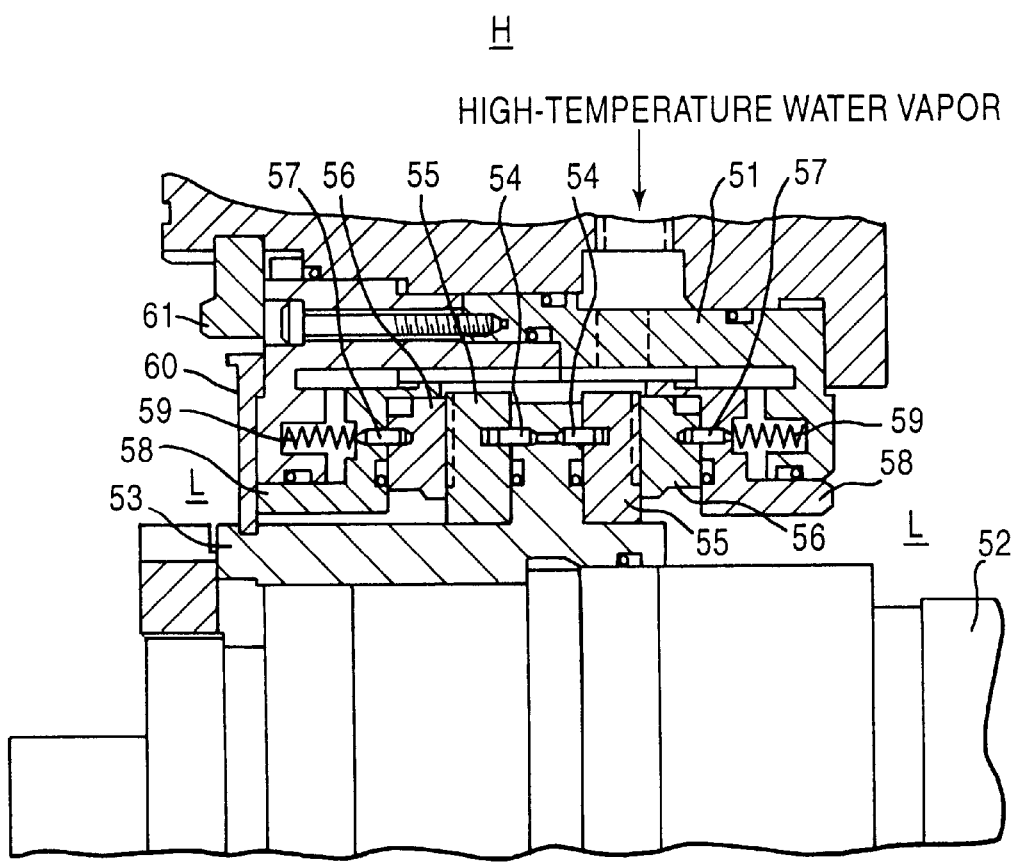
FIG. 19 is a view showing a structure of a non-contact end surface seal of a steam turbine.

Next, a specific example of applying the invention to a mating ring for a steam turbine is described. FIG. 19 is a view showing a structure of a non-contact end surface seal of a steam turbine. In FIG. 19, a rotary shaft 52 stored in a seal housing 51 is provided with a shaft sleeve 53. The shaft sleeve 53 holds a rotary ring 55 (mating ring) via a key 54. Stationary rings 56 are mounted opposite to rotary rings 55. A stainless steel (SUS 420J2) is used as a substrate of the rotary ring 55, and the hard film for the high-temperature slide member according to the present invention is formed on its slide surface by a dynamic mixing method. Further, though not shown, a groove is formed in the slide surface of the rotary ring 55 from a high-pressure side H to a low-pressure side L.

Each of the stationary rings 56 is connected with a seal ring retainer 58 through a pin 57, and a spring 59 is interposed between the seal ring retainer 58 and the seal housing 51. Each of the stationary rings 56 is pressed against the rotary ring 55 via the spring 59 and the seal ring retainer 58. 60 is a lock plate, and 61 is a shearing ring.

In the non-content end surface seal having the foregoing structure, the rotary shaft 52 is rotated to relatively move the rotary ring 55 and the stationary ring 56, whereby the groove formed in the rotary ring 55 catches up a fluid on the high-pressure side H and a fluid film is formed on the sealed surface. This fluid film renders the sealed surface in a non-contact state to form a small space in the sealed surface between the rotary ring 55 and the stationary ring 56.

As has been thus far discussed, the invention can provide the Cr-containing titanium nitride film which is improved in high-temperature corrosion resistance without impairing the high sliding characteristics (wear resistance, low frictional coefficient) inherent in the titanium nitride thin film.

What is claimed is:

1. A Cr-containing titanium nitride film which is composed of a nitride containing Ti and Cr, the crystal particles thereof having a face-centered cubic crystal structure, and the crystal thereof being highly oriented toward (200) face.

2. A Cr-containing titanium nitride film according to claim 1, wherein the nitride containing Ti and Cr has the following structural formula:

TiCrN, where the atomic ratio between Ti and Cr is defined as Ti=100-x, Cr=x and $30\% < x \leq 60\%$, the amount of N based on the total atomic amount of the compound is 20–50%, and the compound contains impurities of oxygen and carbon in an amount of several at %.

3. The Cr-containing titanium nitride film as claimed in claim 1, which has a Vickers hardness of 2,500 or more.

4. The Cr-containing titanium nitride film as claimed in claim 2, which has a Vickers hardness of 2,500 or more.

5. The Cr-containing titanium nitride film as claimed in claim 2, wherein the crystal of the Cr-containing titanium nitride is highly oriented toward (200) face.

6. A metallic material having a wear resistance, comprising a metallic substrate and a Cr-containing titanium nitride film as claimed in claim 1 formed on a surface of the metallic substrate.

7. A metallic material having a wear resistance, comprising a metallic substrate and a Cr-containing titanium nitride film as claimed in claim 2 formed on a surface of the metallic substrate.

8. A slide member comprising a combination of a movable member and a stationary member, one of the movable member and the stationary member being made of a metal, and the other being made of a carbon-containing material, wherein the Cr-containing titanium nitride film as claimed in claim 1 is formed on the slide surface of the movable member or the stationary member made of the metal.

9. A slide member comprising a combination of a movable member and a stationary member, one of the movable member and the stationary member being made of a metal, and the other being made of a carbon-containing material, wherein the Cr-containing titanium nitride film as claimed in claim 2 is formed on the slide surface of the movable member or the stationary member made of the metal.

\* \* \* \* \*